United States Patent
Blackshear et al.

(10) Patent No.: US 9,293,439 B2
(45) Date of Patent: Mar. 22, 2016

(54) ELECTRONIC MODULE ASSEMBLY WITH PATTERNED ADHESIVE ARRAY

(71) Applicant: GLOBALFOUNDRIES Inc., Grand Cayman (KY)

(72) Inventors: Edmund Blackshear, Wappingers Falls, NY (US); Elaine Cyr, Granby, CA (US); Benjamin Vito Fasano, New Windsor, NY (US); Paul Francis Fortier, Richelieu (CA); Marcus E. Interrante, New Paltz, NY (US); Roger Lam, Fishkill, NY (US); Shidong Li, Poughkeepsie, NY (US); Thomas Edward Lombardi, Poughkeepsie, NY (US); Hilton T. Toy, Hopewell Junction, NY (US); Thomas Weiss, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/567,052

(22) Filed: Dec. 11, 2014

(65) Prior Publication Data

US 2015/0093859 A1    Apr. 2, 2015

Related U.S. Application Data

(62) Division of application No. 13/939,606, filed on Jul. 11, 2013, now Pat. No. 9,093,563.

(51) Int. Cl.
| | |
|---|---|
| H01L 23/00 | (2006.01) |
| H01L 21/50 | (2006.01) |
| H01L 23/10 | (2006.01) |
| H01L 23/367 | (2006.01) |
| H01L 23/373 | (2006.01) |
| H01L 23/055 | (2006.01) |

(Continued)

(52) U.S. Cl.
CPC ............. *H01L 24/83* (2013.01); *H01L 21/50* (2013.01); *H01L 23/10* (2013.01); *H01L 23/3675* (2013.01); *H01L 23/3736* (2013.01); *H01L 23/055* (2013.01); *H01L 23/42* (2013.01); *H01L 23/49811* (2013.01); *H01L 23/49822* (2013.01); *H01L 2224/16225* (2013.01); *H01L 2224/32245* (2013.01); *H01L 2224/73253* (2013.01); *H01L 2224/83862* (2013.01); *H01L 2924/15311* (2013.01)

(58) Field of Classification Search
CPC .......... H01L 2924/01079; H01L 2924/01078; H01L 2924/14; H01L 2924/01029; H01L 2924/01013; H01L 21/50; H01L 23/10; H01L 24/83; H01L 2224/16225; H01L 2224/73253; H01L 2224/83862; H01L 23/49822; H01L 23/3736; H01L 23/3675; H01L 23/49811; H01L 23/42; H01L 2924/15311; H01L 2224/32245; H01L 2224/1622

See application file for complete search history.

(56) References Cited

U.S. PATENT DOCUMENTS

| | | | |
|---|---|---|---|
| 5,216,805 | A | 6/1993 | Hallenbeck et al. |
| 5,757,072 | A | 5/1998 | Gorowitz et al. |

(Continued)

*Primary Examiner* — Michelle Mandala
(74) *Attorney, Agent, or Firm* — Heslin Rothenberg Farley & Mesiti P.C.

(57) ABSTRACT

An improved electronic module assembly and method of fabrication is disclosed. A patterned array of adhesive is deposited on a laminate, to which a chip is attached. Each region of adhesive is referred to as a lid tie. A lid is placed on the laminate, and is in contact with the lid ties. The lid ties serve to add stability to the laminate and reduce flexing during thermal processing and mechanical stress.

7 Claims, 5 Drawing Sheets

(51) Int. Cl.
*H01L 23/42* (2006.01)
*H01L 23/498* (2006.01)

(56) References Cited

U.S. PATENT DOCUMENTS

| | | |
|---|---|---|
| 6,268,654 B1 | 7/2001 | Glenn et al. |
| 6,409,859 B1 | 6/2002 | Chung |
| 6,621,158 B2 | 9/2003 | Martin et al. |
| 6,621,161 B2 | 9/2003 | Miyawaki |
| 6,693,349 B2 | 2/2004 | Akram |
| 7,229,852 B2 | 6/2007 | Hoshika |
| 2002/0053735 A1* | 5/2002 | Neuhaus et al. ............. 257/728 |
| 2004/0150097 A1 | 8/2004 | Gaynes et al. |
| 2008/0042302 A1 | 2/2008 | Crispell et al. |
| 2008/0237840 A1* | 10/2008 | Alcoe et al. ................ 257/706 |
| 2012/0068332 A1 | 3/2012 | Park et al. |
| 2013/0052775 A1 | 2/2013 | Kim et al. |
| 2014/0124947 A1* | 5/2014 | Chuang et al. ............. 257/774 |

* cited by examiner

ELECTRONIC MODULE ASSEMBLY WITH PATTERNED ADHESIVE ARRAY

CROSS REFERENCE TO RELATED APPLICATIONS

This application is a division of commonly-owned, copending U.S. patent application Ser. No. 13/939,606 entitled ELECTRONIC MODULE ASSEMBLY WITH PATTERNED ADHESIVE ARRAY and filed on Jul. 11, 2013.

FIELD OF THE INVENTION

The present invention relates generally to the fabrication of electronic devices, and more particularly, to an electronic module assembly with a patterned adhesive array and method of fabrication.

BACKGROUND OF THE INVENTION

Electronic modules which use a cover or lid need to be assembled in a matter that provides mechanical protection while addressing the dimensional, mechanical, thermal and in some cases electrical requirements of the assembly. During a traditional assembly of die onto organic laminates and subsequent adhesive lid attach to the laminate and die, significant stresses can be developed due to respective material thermal expansion mismatches that cause the laminate to warp. This complicates the placement of bottom side solder balls (where ball grid array (BGA) packages attach to cards) if the warpage is severe, since the balls will not sit on a common plane to reliably join to a planar card input/output (IO) array surface with solder. Similar planarity issues are encountered for modules which are joined to, for instance Land Grid Array (LGA) connectors which use compliant contacts such as springs to create electrical paths between the laminate surface and a surface such as a card, board or other electrical interface. The contacts may not all be fully engaged or forcefully mated to be reliable. This problem, referred to as a coplanarity issue, is magnified if the laminate is of low rigidity as is found with coreless laminates, as coreless laminates do not have the traditional thick glass fiber stiffening central core.

In addition to the coplanarity issue, a variety of other thermal and mechanical challenges exist in the fabrication of electronic modules. The warpage that results can have an adverse effect on the thermal interface material (TIM) that resides between the die and the underside of the lid. This TIM provides a physical thermal path for heat generated in the die to flow to the lid and from there be further removed by using heatsinks, coldplates, etc. to prevent overheating of the package and maintain electrical performance of the module. Therefore, it is desirable to have an improved electronic module and methods of fabrication that mitigates the aforementioned problems.

SUMMARY OF THE INVENTION

One aspect of the present invention provides an electronic module assembly comprising: a laminate; a plurality of contacts disposed on a bottom side of the laminate; a semiconductor chip disposed on a top side of the laminate; a seal band disposed on the laminate, forming a perimeter around the chip; a plurality of stabilizing lid ties disposed on the laminate in a region within the perimeter; and a lid disposed on the chip and the laminate, wherein the lid is in contact with the seal band and the plurality of stabilizing lid ties.

Another aspect of the present invention provides an electronic module assembly comprising: a coreless laminate; a plurality of contacts disposed on a bottom side of the laminate; a semiconductor chip disposed on a top side of the laminate; a thermal interface material layer disposed on the chip; a seal band disposed on the laminate, forming a perimeter around the chip; a plurality of stabilizing lid ties disposed on the laminate in a region within the perimeter; and a copper lid disposed on the chip and the laminate, wherein the lid is in contact with the seal band, the thermal interface material layer, and the plurality of stabilizing lid ties.

Another aspect of the present invention provides an electronic module assembly comprising: a laminate; a plurality of contacts disposed on a bottom side of the laminate; a semiconductor chip disposed on a top side of the laminate; a seal band comprised of a plurality of seal band lid ties disposed on the laminate, forming a perimeter around the chip; a lid disposed on the chip and the laminate, wherein the lid is in contact with the plurality of seal band lid ties.

Another aspect of the present invention provides a method for fabricating an electronic module assembly, comprising: placing a chip on a laminate; forming a seal band on the laminate; depositing a patterned array of stabilizing lid ties to the laminate; applying a lid on to the seal band; and curing the electronic module assembly.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
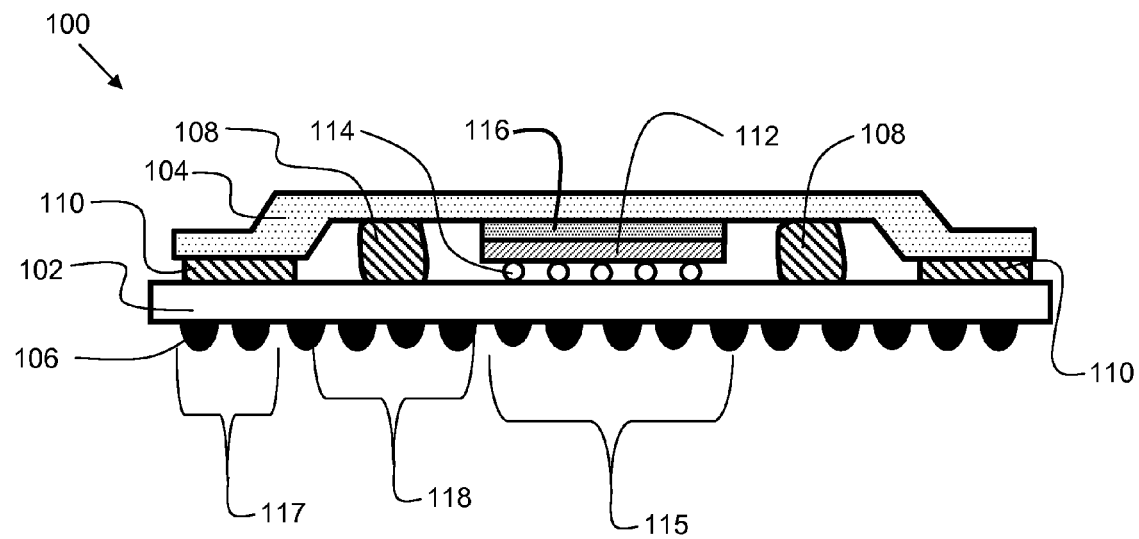

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1A is a side cutaway view of an electronic module assembly in accordance with embodiments of the present invention.

Figure 1B:
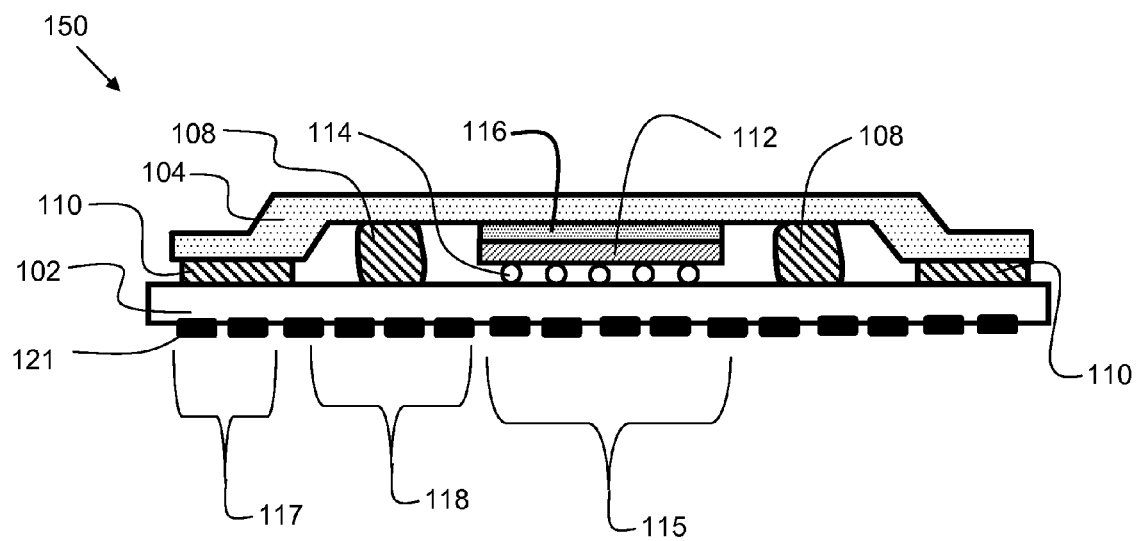

FIG. 1B is a side cutaway view of an electronic module assembly in accordance with additional embodiments of the present invention.

Figure 2:
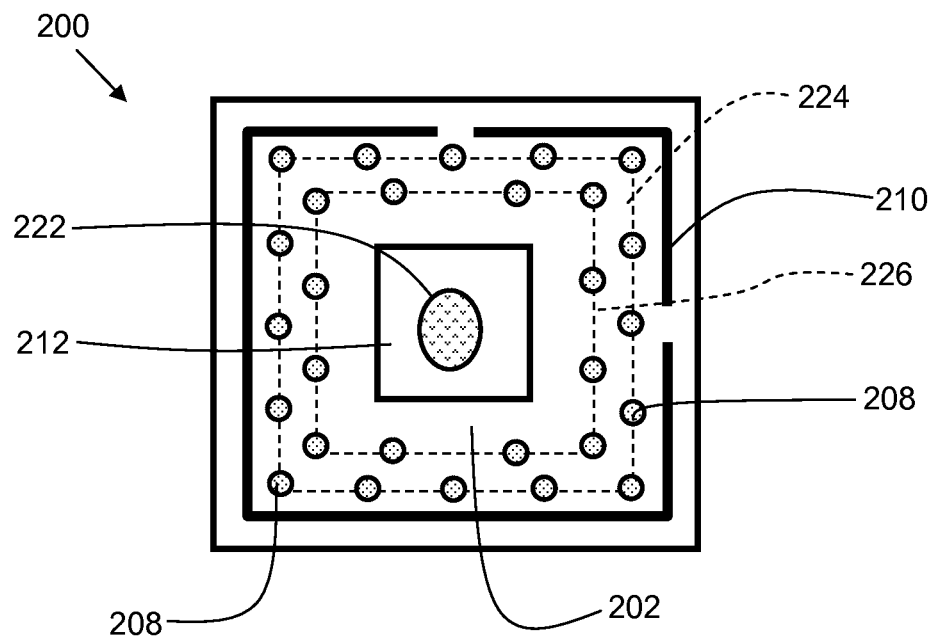

FIG. 2 is a top-down view of an electronic module assembly in accordance with embodiments of the present invention, indicating the seal band and lid ties.

Figure 3A:
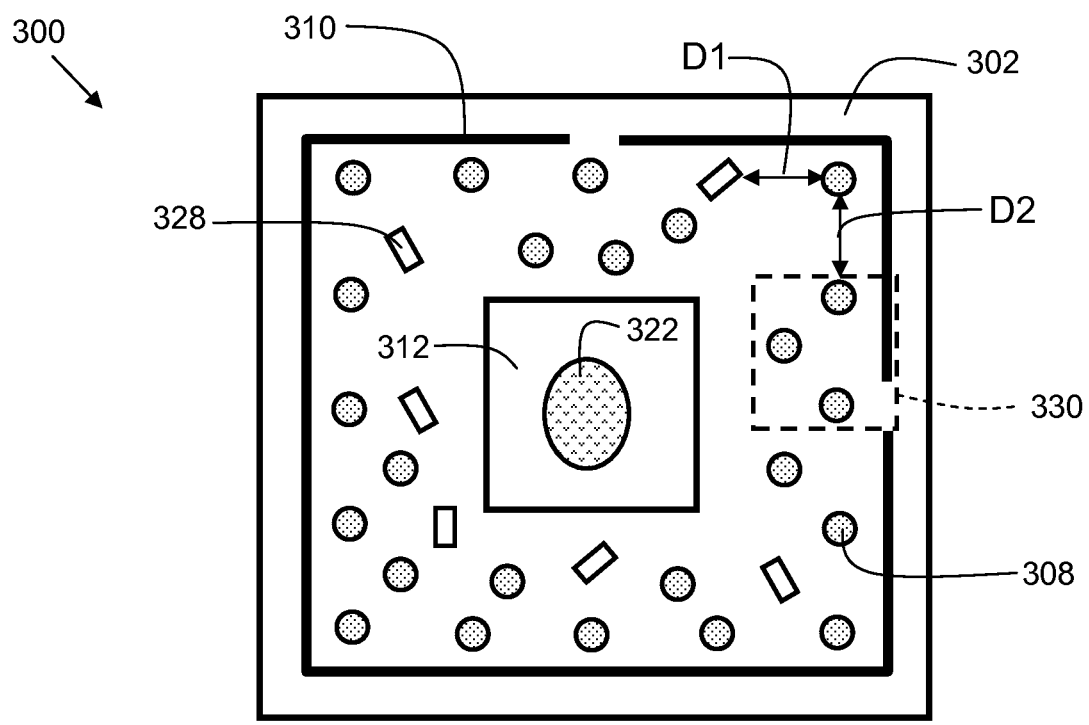

FIG. 3A is a top-down view of an electronic module assembly in accordance with embodiments of the present invention, indicating electrical components.

Figure 3B:
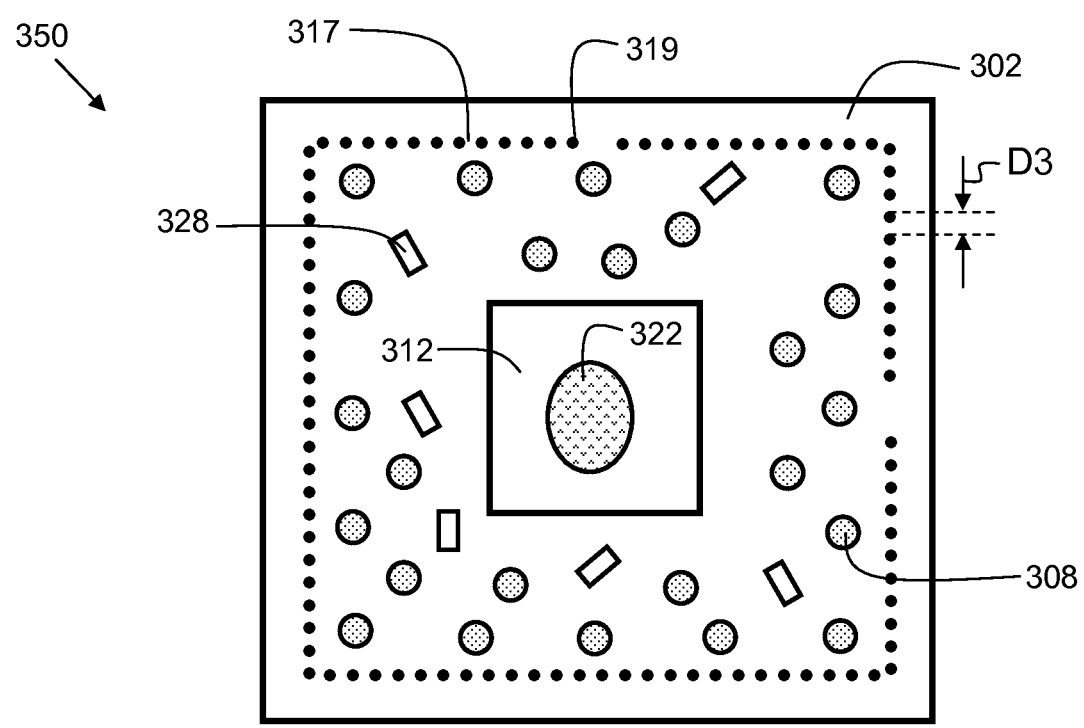

FIG. 3B is a top-down view of an electronic module assembly in accordance with embodiments of the present invention, indicating a seal band comprised of lid ties.

Figure 4:
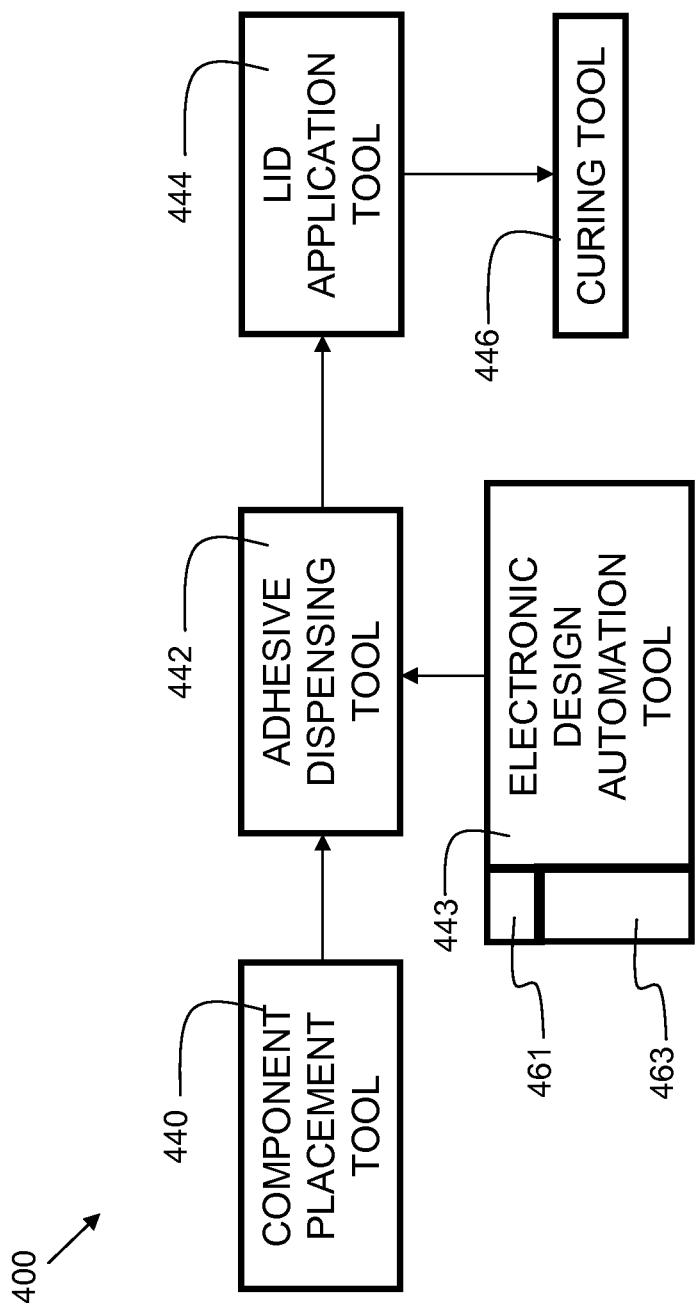

FIG. 4 is a system for fabricating an electronic module assembly in accordance with embodiments of the present invention.

Figure 5:
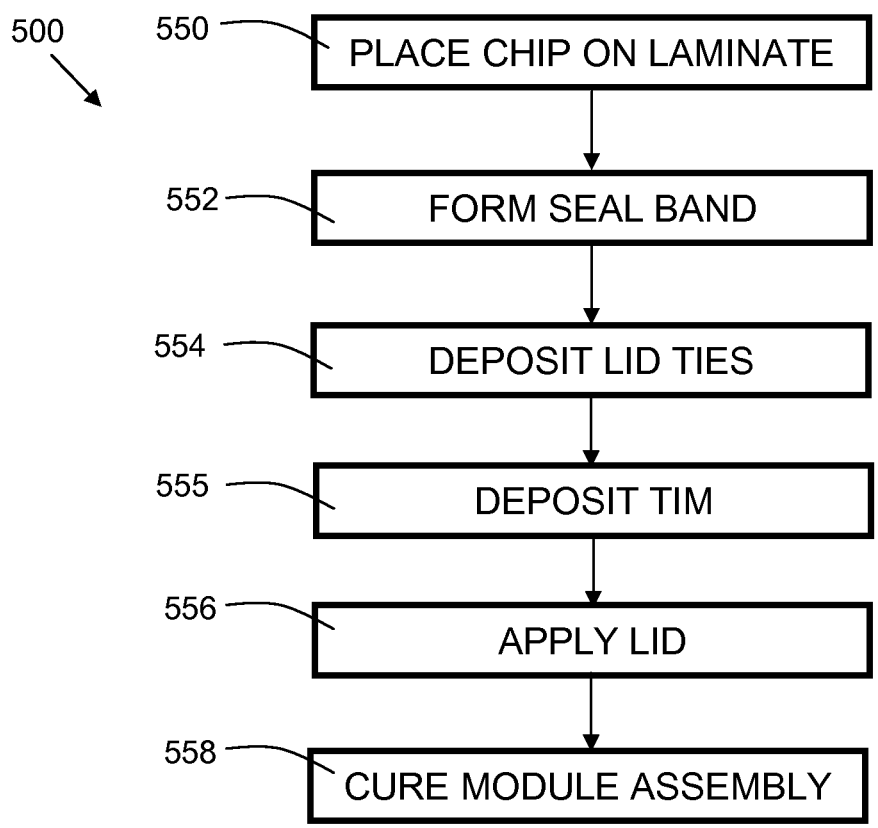

FIG. 5 is a flowchart indicating process steps for embodiments of the present invention.

DETAILED DESCRIPTION

FIG. 1A is a side cutaway view of an electronic module assembly 100 in accordance with embodiments of the present invention. Assembly 100 comprises laminate 102. Laminate 102 comprises multiple electrical contacts and wiring routes, as is known in the art (not shown). In embodiments, laminate 102 may comprise a coreless laminate. Coreless laminates do not have the traditional thick glass fiber stiffening central core. This allows greater wiring flexibility with coreless laminates, as wires and vias can be placed closer together than with core (e.g., Thincore) laminates. However, coreless laminates provide less mechanical rigidity than a core laminate, which has created challenges in the fabrication and subsequent assembly processes. Embodiments of the present invention may also be utilized with core laminates. Hence, in some embodiments, laminate 102 may comprise a core laminate. On the bottom side of laminate 102 is a plurality of electrical contacts 106, each of which is a ball comprising part of a Ball Grid Array (BGA). Disposed on the top side of laminate 102 is a die (chip) 112. Chip 112 may include a logic chip, digital signal processor, microcontroller, microprocessor, graphics processor, or any other semiconductor chip. Chip 112 comprises multiple solder bumps 114, which make electrical contact with the laminate 102. In embodiments, the solder bumps 114 may comprise Controlled Collapse Chip Connection (C4) solder bumps. Disposed on chip 112 is a thermal interface material (TIM) layer 116. Note that the drawings are not to scale, and the TIM layer is typically much thinner than chip 112. The TIM layer serves to conduct heat away from chip 112, and on to lid 104. Lid 104 may be comprised of metal. In some embodiments, lid 104 may be comprised of copper. In other embodiments, lid 104 may be comprised of aluminum. Lid 104 is adhered to laminate 102 by seal band 110. In embodiments, seal band 110 may be comprised of a silicone adhesive. In some embodiments, the silicone adhesive may comprise an epoxy or an RTV (room temperature vulcanizing) silicone adhesive which is applied at room temperature (about 18 degrees Celsius to about 24 degrees Celsius). The region 117 of laminate 102 under the seal band 110 is fairly well supported by lid 104. The region 115 of laminate 102 under the chip 112 is fairly well supported by the chip 112. However, unsupported region 118 is prone to flexing and warpage. To reduce the flexing and provide additional mechanical stability, a patterned array of adhesive is applied. Each element of the patterned array of adhesive is referred to as a "lid tie." As shown in FIG. 1A, two stabilizing lid ties 108 are visible. The stabilizing lid ties 108 may be comprised of the same material as seal band 110. In some embodiments, the material for the lid ties 108 and seal band 110 is EA6700 silicone adhesive from Dow Corning Corporation of Midland, Mich.

FIG. 1B is a side cutaway view of an electronic module assembly 150 in accordance with additional embodiments of the present invention. Electronic module assembly 150 is similar to electronic module assembly 100, except that on the bottom side of laminate 102 is a plurality of contacts 121, each of which is a landing pad, comprising a Land Grid Array (LGA). The land grid array is a packaging technology with a grid of contacts on the underside of a package that uses pressure to establish electrical connection between adjacent contacts. The LGA contacts can be connected to a grid of contacts on the PCB. In some cases, the contact is made by using an LGA socket. In other cases, the LGA may be soldered directly onto a printed circuit board (PCB) on one surface leaving the opposing surface contacts available for connection to a package without the use of solder.

FIG. 2 is a top-down view of an electronic module assembly 200 in accordance with embodiments of the present invention, without the lid, indicating the seal band and lid ties. As stated previously, similar elements may be referred to by similar numbers in various figures (FIGs) of the drawing, in which case typically the last two significant digits may be the same. For example, laminate 202 of FIG. 2 is similar to laminate 102 of FIG. 1. The seal band 210 is disposed on the laminate, forming a perimeter around the chip 212. A thermal interface material (TIM) 222 is applied to the top of the chip 212. This will spread out to cover the entire top of the chip 212 once a lid is applied and forced onto the die during the lid attach process.

A plurality of stabilizing lid ties 208 is disposed on the laminate. In this embodiment, a patterned array of lid ties on the laminate comprises an outer ring 224 of lid ties and an inner ring 226 of lid ties. In some embodiments, between 26 and 30 lid ties are disposed on laminate 202. In some embodiments, 28 lid ties are disposed on laminate 202. In some embodiments, 16 lid ties are in the outer ring 224, and 12 lid ties are in the inner ring 226. As the lid tie material has a non-zero cost, using more material than necessary can add up to a significant cost for devices produced in high volumes. It is therefore desirable to use the minimal amount of lid ties that are needed in order to provide sufficient stability. The stabilizing lid ties 208 may be round, as shown. In other embodiments, other geometries can be used, such as lines, or oval-shaped lid ties.

FIG. 3A is a top-down view of an electronic module assembly 300 in accordance with embodiments of the present invention, indicating electrical components. The electrical components 328 may include, but are not limited to, capacitors, MEMs devices, resistors, diodes, and inductors. It is preferable to maintain a minimum component spacing distance D1 between each stabilizing lid tie 308 and its nearest electrical component 328. In some embodiments, the minimum component spacing distance ranges from about 25 micrometers to about 700 micrometers. The minimum component spacing distance reduces complications during downstream processing. For example, if a lid tie were too close to, or disposed on certain types of electrical components, it could adversely impact solder reflow steps or solder join reliability. Therefore, the position of the lid ties is a predetermined pattern which allows room and positional flexibility for placement of electrical components, while still having a sufficient density per unit area to provide additional support for the laminate. In some embodiments, the unit area 330 is ten square millimeters, and the average lid tie areal density is about 3 lid ties per 10 square millimeters. A distance between two lid ties, referred to as a lid tie interspacing distance D2, is a parameter that affects the average lid tie density. In some embodiments, the average lid tie interspacing distance ranges from about 2 millimeters to about 20 millimeters. In some embodiments, the average lid tie interspacing distance ranges from about 6 millimeters to about 10 millimeters. These values and placement positions are optimized for each design and can be verified using thermomechanical models.

In some embodiments, a stabilizing lid tie may be used on a component, and may completely cover the component. In some cases the joining technique for components allows a lid tie to contact a component, such as for C4 attached decaps which are underfilled, conductive epoxy joins, higher T solder joins that do not re-melt during BGA attach, or for LGA modules.

FIG. 3B is a top-down view of an electronic module assembly 350 in accordance with embodiments of the present invention, indicating a seal band 317 comprised of a plurality of seal band lid ties, indicated generally as reference 319. In some embodiments, the seal band lid ties 319 may have the same size as the stabilizing lid ties 308. The seal band lid ties 319 may be made from the same material as stabilizing lid ties 308, or in some embodiments, the seal band lid ties 319 may be comprised of a different material than stabilizing lid ties 308. The seal band lid ties 319 may have an interspacing distance D3. In some embodiments, the seal band lid tie interspacing distance D3 may range from about 0.7 millimeters to about 2.3 millimeters. The greater the interspacing distance D3, the less material is used, and hence, additional cost is saved. However, there is a tradeoff between the interspacing distance D3 and the adhesion of the lid. If too few seal band lid ties are used, the lid may not be sufficiently secured to the laminate 302.

FIG. 4 is a system 400 for fabricating an electronic module assembly in accordance with embodiments of the present invention. A component placement tool 440 is configured to place electrical components on the laminate. The component placement tool may use vacuum to pick up parts from a dispensing mechanism such as a tape feeder, and place them on the laminate at the appropriate location and orientation. An adhesive dispensing tool 442 is configured to deposit the seal band and lid ties. In embodiments, the adhesive dispensing tool 442 uses a robotically controlled syringe to dispense the adhesive that makes up the seal band and lid ties. In some embodiments, the adhesive dispensing tool 442 dispenses lid ties that have a height of about 1.5 millimeters to about 2 millimeters. The placement of the lid ties enables critical areas to be reinforced more than other, less stressed regions. For example, additional lid ties may be placed near the corners of a chip for additional reinforcement in those areas. Selective placement provides flexibility in avoiding regions where adhesives could create damage to components (e.g. overcoating MEMS, or tunable circuitry). In embodiments, the placement may be based on where electrical components may exist. The locations of electrical components may be designated as lid tie prohibit or 'keep out' regions, where no lid tie can be placed. In embodiments, the adhesive dispensing tool may receive data from an electronic design automation (EDA) system 443. The received data may include lid tie prohibit region location information. The EDA system 443 may comprise a processor 461 which is configured to access memory 463. Memory 463 may be a non-transitory memory containing instructions, which when executed by processor 461, determine a location for each lid tie. Various parameters may be used in the determination of lid tie locations, including, but not limited to, a desired lid tie density per unit area, a minimum component spacing distance, and a desired lid tie interspacing distance. The EDA system 443 may compute positional information for each lid tie and transmit the positional information to the adhesive dispensing tool 442 so that lid ties are dispensed in the desired locations.

Patterned deposition of lid ties greatly reduces the quantity of material used to reduce overall costs of making assemblies (in some cases, the lid tie material may cost a few dollars per gram). Once the lid ties are in place, along with the thermal interface material and seal band, a lid application tool 444 applies a lid to the electronic module assembly. The lid makes contact with the lid ties, and compresses the lid ties, causing the lid ties to spread out to a compressed diameter. Once spread out, the lid ties may have a compressed diameter ranging from about 1.8 millimeters to about 2.3 millimeters. The lid application tool 444 may utilize a vacuum to pick up a lid. The lid application tool may then use a gantry or other robotically controlled mechanism to place the lid on the electronic module assembly. In some embodiments, applying a lid on to the seal band comprises applying the lid with a downward force ranging from about 5 pounds to about 30 pounds. In some embodiments, the downward force is applied for a duration ranging from about 20 seconds to about 30 seconds. The curing tool 446 heats the electronic module assembly to cure the adhesive used to form the seal band and lid ties. In some embodiments, the curing tool may be an oven, and may provide an oven processing temperature ranging from about 100 degrees Celsius to about 180 degrees Celsius. In embodiments, the curing time may range from about 10 minutes to about 120 minutes. Other means of curing may also be used to drive the needed chemical reactions for the desired thermal and mechanical property development of the adhesives and TIM. These can include using a belt furnace, microwave curing chamber, or multi-stage thermal curing steps.

FIG. 5 is a flowchart 500 indicating process steps for embodiments of the present invention. In process step 550, a chip is placed on a laminate (see 112 of FIG. 1). In process step 552, a seal band is formed on a laminate (see 202 of FIG. 2). In process step 554, lid ties are deposited (see 208 of FIG. 2). In process step 555, a thermal interface material (TIM) is applied. This may be performed with the same tool (442 in FIG. 4) as that which dispenses the seal band and/or lid tie material, by using an additional dispensing syringe. The order of some of the steps can vary. The dispensing of the TIM material may be done either before the seal band and lid tie dispense or after. In process step 556, a lid is applied (see 104 of FIG. 1). In process step 558, the module assembly is cured to stiffen the seal band and lid ties. Note that while an exemplary order is shown in FIG. 5, the steps may be performed in a variety of sequences. For example, the lid ties may be applied before the seal band is formed. In some embodiments, the location of the lid ties may be determined by the location of discrete electrical components (see 328 of FIG. 3).

Embodiments of the present invention provide an improved electronic module assembly and method of fabrication. A patterned array of adhesive is deposited on a laminate, to which a chip is attached. Each region of adhesive is referred to as a lid tie. A lid is placed on the laminate, and the lid is in direct physical contact with the lid ties. The lid ties serve to add stability to the laminate and reduce flexing during thermal processing and mechanical stress. This improves the coplanarity of the ball grid array, resulting in improved product yield. Another advantage provided by embodiments of the present invention is reduced thermal interface material (TIM) tearing. TIM tearing is caused by flexing of the laminate, and can result in voids in the TIM. These voids degrade the ability of heat to transfer from the chip. Therefore, TIM tearing can affect performance and reliability of a chip. By using the lid ties, laminate warpage and flexing is reduced, which in turn reduces the TIM tearing. Another advantage provided by embodiments of the present invention is improved burn-in (BI) resiliency when modules may be socketed using probes that are pressed against the bottom surface contacts to establish electrical connections while the module is heated and electrically tested. During this BI test, unsupported regions of the laminate can undergo permanent deformation resulting from the load from the probes. Lid ties may serve to minimize this deformation and prevent potential electrical reliability defects while also preserving a planar surface when needed for subsequent joining operations. While illustrative embodiments show attaching of chips to laminates, embodiments of the present invention may also be utilized to attach laminates to other laminates.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for fabricating an electronic module assembly, comprising:
   placing a chip on a laminate;
   forming a seal band on the laminate;
   depositing a patterned array of stabilizing lid ties to the laminate, wherein depositing a patterned array of lid ties to the laminate comprises depositing an outer ring of lid ties and an inner ring of lid ties comprised of silicone adhesive, and wherein the outer ring and inner ring each form a perimeter around the chip;
   applying a lid on to the seal band; and
   curing the electronic module assembly.

2. The method of claim 1, further comprising applying a thermal interface material layer on the chip.

3. The method of claim 1, further comprising applying electric components to the laminate.

4. The method of claim 1, wherein depositing a patterned array of stabilizing lid ties to the laminate is performed with a syringe.

5. The method of claim 1, wherein forming a seal band on the laminate comprises forming a plurality of seal band lid ties.

6. The method of claim 1, wherein curing the electronic module assembly comprises heating the electronic module assembly in an oven with an air temperature ranging from about 100 degrees Celsius to about 180 degrees Celsius.

7. The method of claim 1, wherein curing the electronic module assembly comprises heating the electronic module assembly for a duration ranging from about 10 minutes to about 120 minutes.

* * * * *